United States Patent [19]

Gnade et al.

[11] Patent Number: 6,033,919
[45] Date of Patent: *Mar. 7, 2000

[54] METHOD OF FORMING SIDEWALL CAPACITANCE STRUCTURE

[75] Inventors: Bruce Gnade, Dallas; Scott Summerfelt, Garland, both of Tex.; Peter Kirlin, Newtown, Conn.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/955,761

[22] Filed: Oct. 22, 1997

[51] Int. Cl.[7] .......................... H01L 21/8242; H01G 7/06
[52] U.S. Cl. ............................................... 438/3; 438/254
[58] Field of Search ................................ 257/295–296, 257/301; 438/3, 238–240, 253–256, 381, 390–399

[56] References Cited

U.S. PATENT DOCUMENTS

| | | | |
|---|---|---|---|
| 5,276,343 | 1/1994 | Kumagai et al. | 257/306 |
| 5,498,889 | 3/1996 | Hayden | 257/301 |
| 5,561,308 | 10/1996 | Kamata et al. | 257/301 |
| 5,581,436 | 12/1996 | Summerfelt et al. | |
| 5,633,781 | 5/1997 | Saenger et al. | 361/321.4 |
| 5,828,094 | 10/1998 | Lee | 257/296 |

*Primary Examiner*—Jey Tsai
*Attorney, Agent, or Firm*—Jacqueline J. Garner; Wade James Brady, III; Richard L. Donaldson

[57] ABSTRACT

A capacitive structure on an integrated circuit and a method of making the same are disclosed, which is particularly useful in random-access memory devices. Generally, the method of the present invention comprises the steps of forming a substantially vertical temporary support 54 (preferably by forming a cylindrical aperture in an insulating layer) on a semiconductor substrate 10 and forming a substantially vertical dielectric film 32 (preferably a high dielectric constant perovskite-phase dielectric film, and more preferably barium strontium titanate) on temporary support 54. The method further comprises depositing a first conductive (e.g. platinum) electrode 60 on substantially vertical dielectric film 32, and subsequently replacing temporary support 54 with a second conductive (e.g. platinum) electrode 64, such that a thin film capacitor 44 which is substantially vertical with respect to substrate 10 is formed. The entire capacitor is essentially self-aligned, such that some embodiments require only one lithography step to complete the capacitor. Also, an advantage of this method is that a high temperature, high oxygen activity dielectric deposition may be completed prior to formation of either electrode, thus greatly simplifying both electrode structure and processing.

17 Claims, 5 Drawing Sheets

METHOD OF FORMING SIDEWALL CAPACITANCE STRUCTURE

FIELD OF THE INVENTION

This invention relates generally to structures and fabrication methods for integrated circuits and more specifically to capacitive structures formed on such circuits, such as charge storage devices in random access memories.

BACKGROUND OF THE INVENTION

Integrated circuits such as those formed on single-crystal silicon substrates may typically include miniature capacitive structures integrated into the device circuitry. Each of these capacitive structures typically comprises a dielectric material sandwiched between bottom and top conductive electrodes. An integrated circuit such as a dynamic random access memory (DRAM) may contain millions of essentially identical capacitive structures, each of which functions as a charge storage device for one memory cell.

As the number of memory cells integrated in a circuit design increases, it is desirable to decrease the circuit surface area required for each capacitor, while maintaining sufficient capacitive charge storage capability to insure reliable operation. To this end, new dielectric materials have been sought with significantly higher dielectric constant than either silicon dioxide or silicon nitride. One class of these materials is the perovskite-phase metal oxides, typified by barium strontium titanate (BST) and lead zirconate titanate (PZT). Thin films of these materials may possess dielectric constants several orders of magnitude higher than conventional dielectrics. Many of these perovskite materials are also ferroelectric (they have the ability to at least semi-permanently alter crystal structure to retain an electric field polarization), making them attractive candidates for non-volatile ferroelectric random access memories.

A typical prior-art capacitor structure is shown in FIG. 1. This structure is formed on a semiconductor substrate 10 having an overlying field oxide 14 and a doped contact region 12. A polysilicon contact plug 16 provides electrical connection to contact region 12. A barrier layer 18 of a material such as TiN or TiAlN is interposed between platinum bottom electrode 20 and contact plug 16, to prevent downward diffusion of oxygen and upward diffulsion of silicon. A BST film 22 and a platinum top electrode 24 complete the capacitor structure. Although such a structure overcomes many BST-related problems, electrode oxidation and hillock formation problems remain because the bottom electrode structure is exposed to the high-temperature, strongly oxidizing environment commonly used for BST deposition. Also, the complex electrode structure of FIG. 1 requires multiple photolithography steps which degrade process margin for alignment-limited devices.

SUMMARY OF THE INVENTION

The present invention provides a novel method and structure for overcoming the difficulties found in prior art capacitors and processes, by totally departing from the conventional electrode structure. This departure provides a parallel plate capacitor having both electrodes deposited after dielectric deposition. It is recognized herein that this approach greatly reduces the requirements on the electrode material and allows a higher quality dielectric material to be deposited, as the electrode is no longer present during the high temperature, high oxygen activity dielectric deposition process. An additional advantage of the present invention is that the process/structure is self-aligned, and in principle the entire capacitor may be formed with a single lithography step.

The present invention is apparently the first to form a thin film capacitor on a semiconductor substrate wherein the dielectric film is formed prior to formation of either capacitor electrode. Because the dielectric film is supported throughout fabrication, extremely thin dielectrics are achievable with the present invention, even with dielectric materials which are inherently difficult to pattern. The structure itself has a reliability advantage, in that it allows formation of a true parallel-plate capacitor which has no sharp corners that can lead to localized high fields in the dielectric and premature dielectric breakdown. Furthermore, the present invention may provide a circuit miniaturization advantage, as it allows formation of vertically integrated capacitive structures.

Generally, the present invention provides a method of forming a microelectronic device on a semiconductor substrate comprising the steps of forming a substantially vertical temporary support on the substrate and forming a substantially vertical dielectric film on the temporary support. A first conductive electrode is subsequently deposited on the substantially vertical dielectric film, after which the temporary support is replaced with a second conductive electrode. This process forms a thin film capacitor which is substantially vertical with respect to the substrate, as the electrodes are separated by the substantially vertical dielectric film.

In another aspect, the present invention provides a more specific method of forling a microelectronic device on a semiconductor substrate comprising the steps of depositing a sacrificial (preferably insulating) layer over the substrate and anisotropically etching a pattern in the sacrificial layer, thus creating at least one substantially vertical sidewall extending at least partially through the sacrificial layer. The method further comprises forming a dielectric film on the sidewall having an inner surface in contact with the sidewall and a substantially vertical outer surface, and forminng a first conductive electrode directly upon this outer surface. The method further comprises removing at least a portion of the sacrificial layer contacting the inner surface of the dielectric film in order to expose this inner surface, and forming a second conductive electrode electrically contacting this inner surface. Thus the first and second conductive electrodes and the dielectric film comprise a capacitive structure having two electrodes and an intervening dielectric wherein the dielectric is formed prior to formation of either electrode.

The sacrificial layer may comprise at least a bottom sublayer (preferably of silica, e.g. field oxide) and a top sublayer (e.g. of silicon nitride or polysilicon) where the bottom sublayer is substantially unaffected by anisotropic etching of the top sublayer. The anisotropic etching step may form an aperture or a post (either of which is preferably cylindrical) defined by at least one sidewall. After formation of the dielectric film, an aperture may be extended through the sacrificial layer to the semiconductor substrate. Such an aperture may also be used as a self-aligned implant mask. The formation of either the first or second electrode may complete an electrical connection to the semiconductor substrate. Forming an electrode may comprise depositing a noble metal layer upon the dielectric film and depositing a contact metal upon the noble metal layer. Forming a dielectric thin film may comprise substantially conformally depositing a dielectric film and anisotropically etching the dielectric film, preferably using a method such as ion-milling. The dielectric film is preferably a perovskite-phase dielectric material, and more preferably barium strontium titanate.

An integrated circuit formed according to the present invention may comprise a semiconductor substrate, a first conductive electrode electrically contacting the substrate and having at least one substantially vertical surface, a second conductive electrode having at least one substantially vertical surface spaced apart from and substantially parallel to the vertical surface of the first electrode, and a perovskite-phase dielectric film interposed between the first and second substantially vertical surface. The first and second conductive electrodes and dielectric film preferably form a capacitive structure having essentially only sidewall capacitance on the integrated circuit.

The capacitive structure is preferably cylindrical, and more preferably comprises a cylindrical first electrode and an annular second electrode. A cylindrical electrode may comprise a core of a contact material and a shell of a noble metal interposed between the core and the dielectric film. The capacitive structure may form a charge storage device for a random access memory cell. A random access memory according to the present invention may comprise an array of memory cells, each comprising a charge storage capacitor having essentially only sidewall capacitance.

BRIEF DESCRIPTION OF THE DRAWINGS

The present invention, including various features and advantages thereof, may be best understood by reference to the following drawing, wherein.

DETAILED DESCRIPTION OF THE PREFERRED EMBODIMENTS

The present invention relates to a method and structure for integrated circuits containing capacitors. Several preferred embodiments are described herein with reference to DRAM circuits, with the realization that the present invention may also be applied to ferroelectric random access memory circuits or other capacitor-containing integrated circuits.

As circuit surface area allotted for an integrated circuit capacitor is decreased, perovskite-phase materials with high dielectric constant may become almost a necessity. Unfortunately, the deposition conditions for most perovskite-phase materials include high temperature and high oxygen activities which may cause significant problems for conventional bottom electrodes. For example, an ideal BST capacitor bottom electrode would:

not react with BST nor degrade BST electrical properties;

remain conductive after BST deposition;

prevent the interdiffusion of silicon, BST, and oxygen;

maintain a low resistance contact to underlying silicon;

adhere to silicon and $SiO_2$;

maintain a stable morphology; and be manufacturable.

Figure 1:
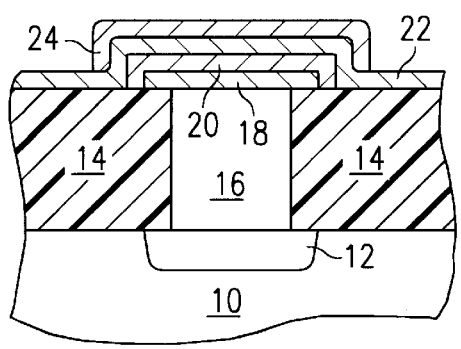
FIG. 1 illustrates a cross-section of a prior art capacitive structure.

Generally, the high temperature and high oxygen activity constraints limit the electrode choices to noble metals such as gold and platinum, or conductive oxides. Platinum has typically been the electrode material of choice because of its previous use in semiconductor manufacturing, and because it has a high work function which helps reduce capacitor leakage current by raising the Schottky barrier height between the dielectric and the electrodes. While platinum has many advantages, several disadvantages persist. Oxygen diffuses very rapidly through polycrystalline platinum, primarily along the grain boundaries. Thus an oxidation resistant barrier material is required between the platinum electrode and the underlying device contact. Also, under BST deposition conditions, the platinum bottom electrode has a tendency to roughen, or even form relatively large (>50 nm) hillocks. The formation of hillocks of the same order as the film thickness significantly increases capacitor leakage current, and can even lead to shorts between the top and bottom electrode. Such problems are prevalent in designs such as the prior art capacitor structure of FIG. 1.

Figure 2A:
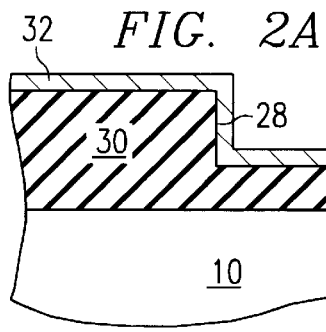
FIGS. 2A–2G contain cross-sections which illustrate steps in a process of forming a capacitive structure according to the present invention.
Figure 2B:
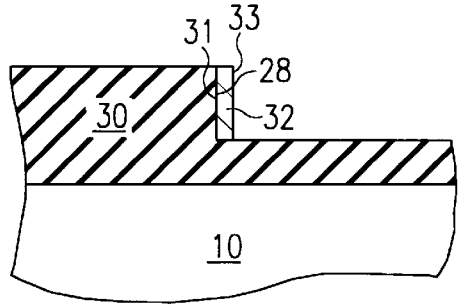

As an introduction to the present invention, FIGS. 2A–2G illustrate a method of constructing a vertical planar parallel-plate capacitor. Referring to FIG. 2A, an insulating layer 30 may be formed and patterned on a semiconductor substrate 10 (e.g. of single-crystal silicon), as known in the art. Layer 30 may be selected from one of several choices both as to configuration and material, with a single silicon dioxide layer being representative. A pattern is etched partially through layer 30, such that a substantially vertical sidewall 28 is formed to provide a temporary support. A dielectric film 32 (e.g. of BST) is then formed on sidewall 28, and may also be formed on horizontal surfaces, although coverage on horizontal surfaces is not essential. BST may be deposited by known methods such as metal-organic decomposition and annealing of spun-on or chemical vapor-deposited precursor films. FIG. 2B shows dielectric film 32 after an unmasked anisotropic etch (e.g. ion-milling) which removes the film from horizontal surfaces, leaving the portion of film 32 shown, with an inner surface 31 contacting sidewall 28 and a substantially vertical outer surface 33.

Figure 2C:
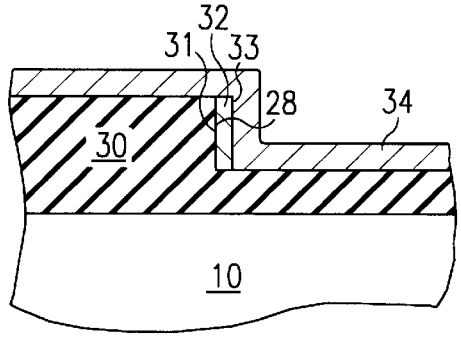
Figure 2D:
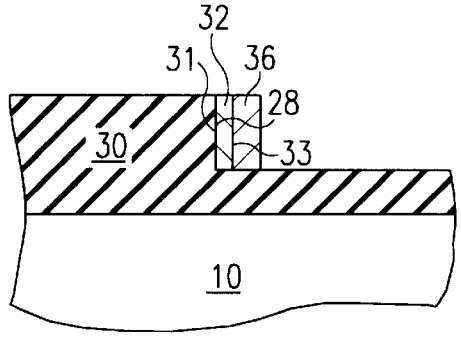
Figure 2E:
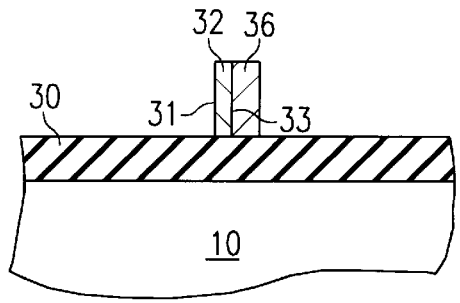
Figure 2F:
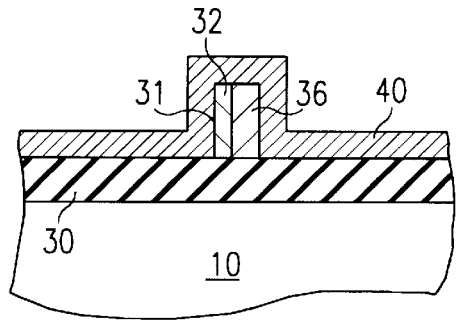
Figure 2G:
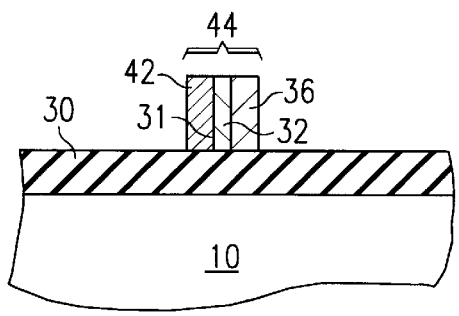

FIG. 2C shows a first conductive film 34 (e.g. of platinum) deposited substantially conformahly over layer 30 and film 32. This conductive film may also be anisotropically etched, for example, to create first conductive electrode 36 contacting dielectric film outer surface 33, as shown in FIG. 2D. Temporary support 28 is then preferably removed to expose inner surface 31 of dielectric film 32, which is now supported by first electrode 36 (FIG. 2E). Finally, FIGS. 2F and 2G show, respectively, a second conductive film 40 and a second conductive electrode 42, which may be formed similar to first electrode 36. Second electrode 42 is electrically connected to inner surface 31 of dielectric film 32, such that electrodes 36 and 42, separated by dielectric film 32, form a capacitive structure 44 which has essentially only sidewall capacitance.

It is recognized herein that this structure is particularly suited for large storage capacity DRAM integrated circuits, such as those containing 256 Mbit or 1 Gbit or more of data storage. At these storage capacities, sidewall capacitors may be fabricated with more electrode area than a horizontal planar capacitor requiring the same circuit space. One preferred embodiment of the present invention is a cylindrical sidewall capacitor having a cylindrical inner electrode spaced apart from an annular outer electrode with a perovskite-phase dielectric intervening between the electrodes. As the electrodes of such a capacitor can be made with essentially no sharp edges at the dielectric interface, localized high fields and premature breakdown in the dielectric may be avoided with the cylindrical structure.

Figure 3A:
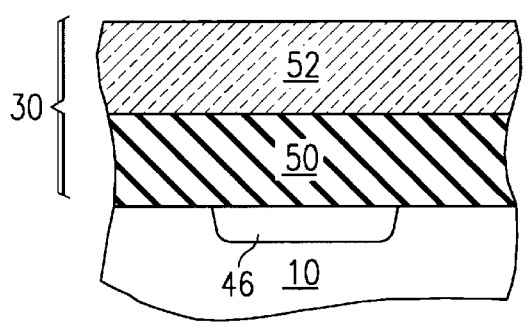
FIGS. 3A–3J contain cross-sections which illustrate steps in a detailed process according to the present invention for forming a capacitive structure electrically connected to a semiconductor substrate.

With reference to FIGS. 3A–3J, a process for creation of a cylindrical sidewall capacitor electrically connected to a semiconductor substrate will now be described. FIG. 3A shows a semiconductor substrate 10 (e.g. of bulk or epitaxial single-crystal silicon) having a doped region 46 and an overlying insulating layer 30, comprised of an insulating bottom sublayer 50 and a sacrificial top sublayer 52. Sublayer 50 may be a field oxide layer, in which case it may be advantageous to form sublayer 52 of a material which can be selectively etched with respect to sublayer 50, such as silicon nitride or doped silicon dioxide. In any case, sublayer 52 should preferably be selectively etchable with respect to the dielectric and first electrode materials to circumvent additional photolithography steps. Sublayer 52 may typically be 100 nm to 1000 nm in thickness, with 300 nm being preferable for a 1 Gbit-type device.

Figure 3B:
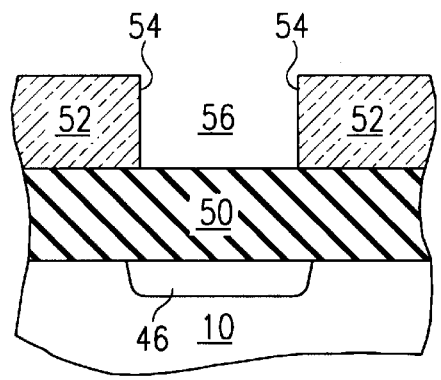
Figure 3C:
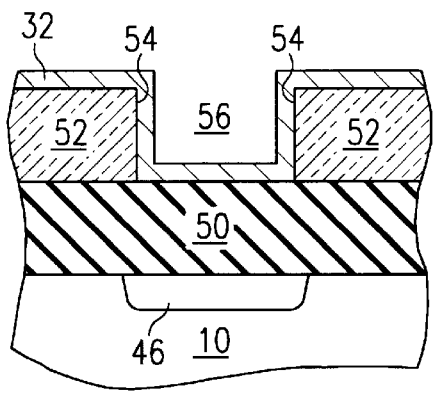
Figure 3D:
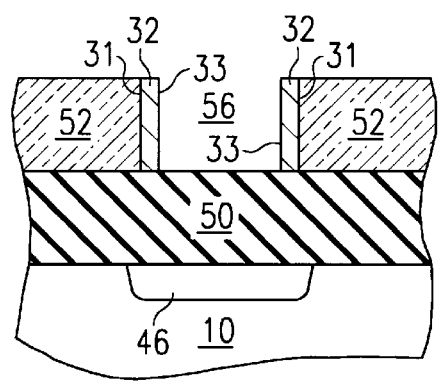

As shown in FIG. 3B, an aperture 56 may be opened in layer 52 near the location of doped region 46 using an etch that stops on field oxide 50. Tis aperture is preferably cylindrical, with a substantially vertical sidewall 54 forming a temporary support for dielectric deposition. FIGS. 3C and 3D depict the formation of dielectric film 32 (preferably of BST) with an inner surface 31 contacting sidewall 54 and a substantially vertical outer surface 33. An advantage of the present invention is that only field oxide 50 and sacrificial sublayer 52 are exposed during the dielectric deposition, such that desired dielectric firing conditions such as high temperature oxidizing ambients may be used without concern for hillock formation, interfacial oxide formation, or electrode failure. Preferably, film 32 has a final thickness of 10–100 nm (more preferably about 50 nm).

Figure 3E:
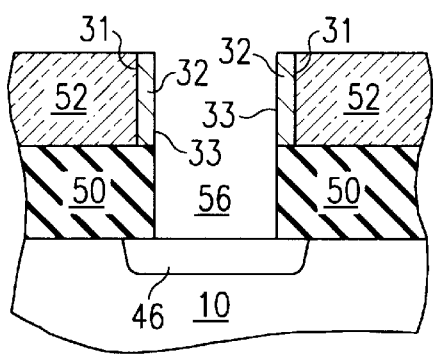

FIG. 3E illustrates another advantage of the present invention, in that aperture 56 containing dielectric film 32 may be used as a mask for forming an opening through field oxide 50 to doped region 46. As shown in FIG. 3E, aperture 56 may be extended through field oxide 50 using an anisotropic etch which is selective to sublayer 50.

Figure 3F:
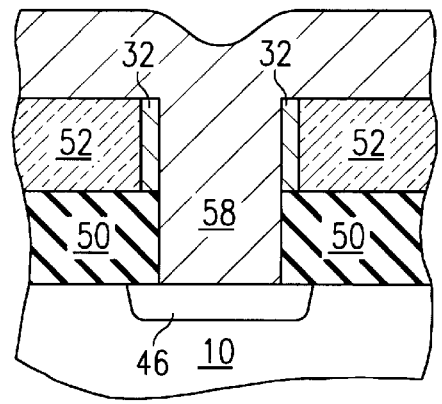
Figure 3G:
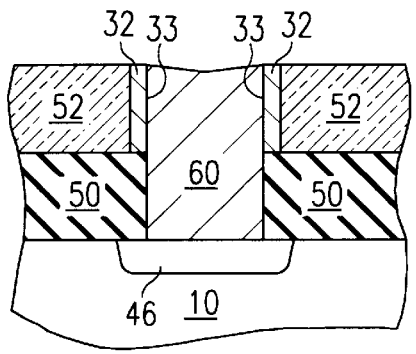
Figure 3H:
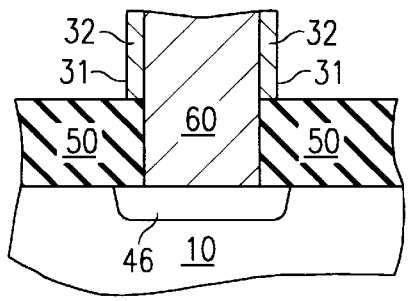

In FIG. 3F, a first conductive film 58 is shown filling aperture 56 and making a contact with doped region 46. Film 58 may be a single material, such as platinum, or a multilayer structure as shown in a later embodiment. FIG. 3G depicts first electrode 60 contacting dielectric film 32 at outer surface 33. First electrode 60 is typically formed either by etchback or chemical-mechanical planarization of conductive film 58. Once first electrode 60 is completed, sacrificial layer 52 may be selectively removed, exposing dielectric inner surface 31. At this point, first electrode 60 supports dielectric flim 32 (FIG. 3H).

Figure 3I:
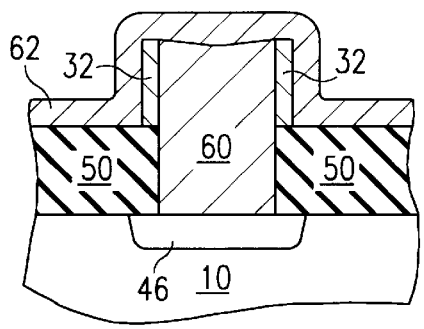
Figure 3J:
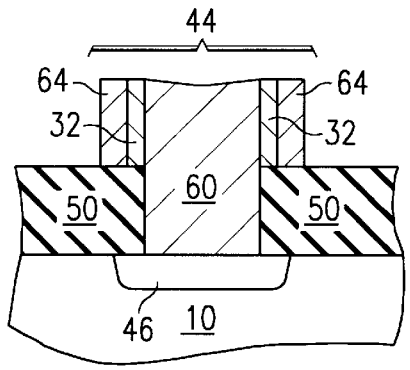
Figure 4:
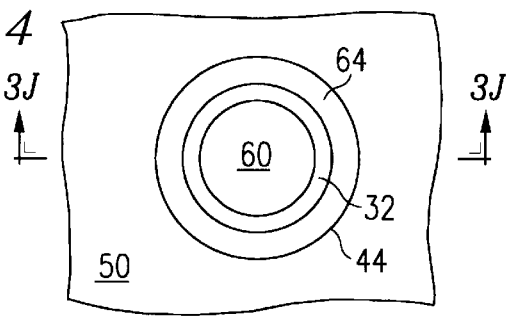
FIG. 4 is a plan view illustrating one possible configuration for the cross-section of FIG. 3J.

As shown in FIGS. 3I and 3J, a blanket deposition of a second conductive film 62 may be combined with an anisotropic etchback (e.g. ion milling) to form second conductive electrode 64 electrically contacting dielectric film 32. It is evident from these two figures that the anisotropic etchback should fully remove film 62 from the top of the capacitor to avoid shorting of the inner and outer electrodes. Finally, FIG. 4 shows a plan view of FIG. 3J, illustrating a cylindrical arrangement for sidewall capacitor 44. Although the cylindrical shape is preferred, this method may be used with other common configurations such as square, rectangular, or hexagonal columnar capacitors, elliptical cylindrical capacitors, or more complex designs such as those having concavities.

Figure 5A:
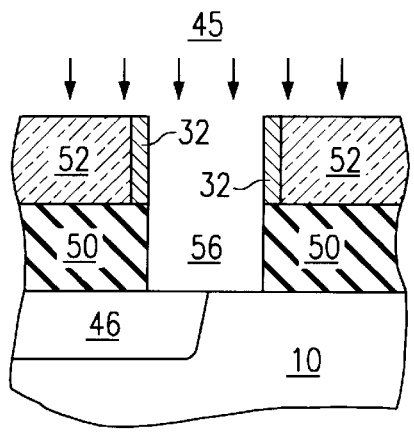
FIGS. 5A–5B contain cross-sections which illustrate a self-aligned ion implant according to the present invention.
Figure 5B:
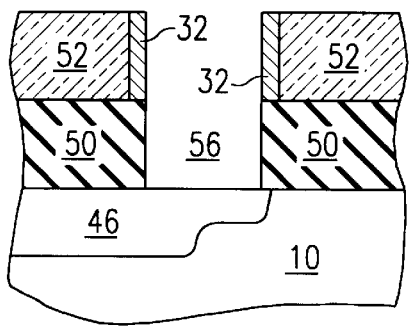

FIGS. 5A and 5B illustrate an ion implantation method that may be used to form a contact region in substrate 10 after formation of dielectric film 32. FIG. 5A is similar to FIG. 3E, except doped region 46 (which may be part of an active device) is misaligned with aperture 56. A self-masked ion implant may be performed by directing ions 45 at substrate 10. Ions impinging on sacrificial sublayer 52 and dielectric film 32 will be stopped, such that a doped contact region will be formed in substrate 10 only at the location of aperture 56. As shown in FIG. 5B, this step may be used to form a self-aligned contact to the substrate, even if doped region 46 is slightly misaligned. Some common dopants (e.g. boron) have extremely low solubility in BST and should not greatly affect the dielectric properties of film 32.

Figure 6A:
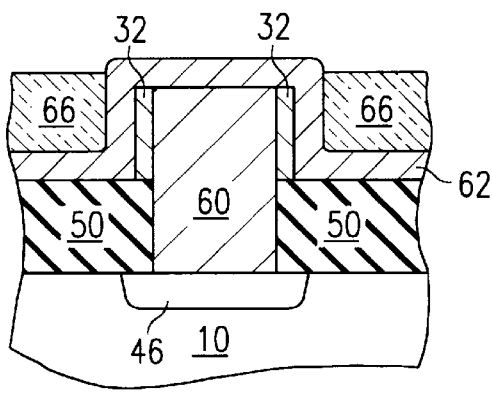
FIGS. 6A–6D contain cross-sections which illustrate one method of forming a contact point for an electrode formed according to the present invention.
Figure 6B:
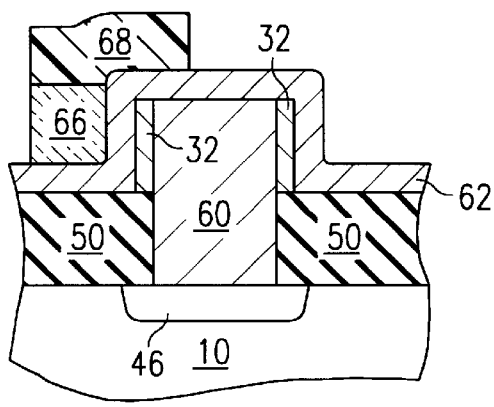
Figure 6C:
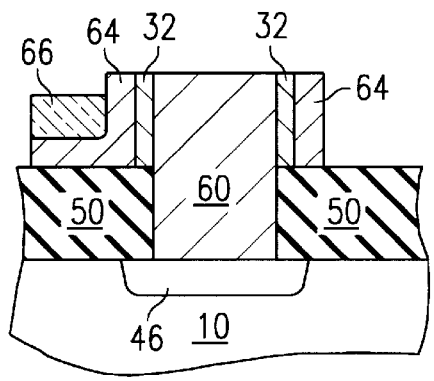
Figure 6D:
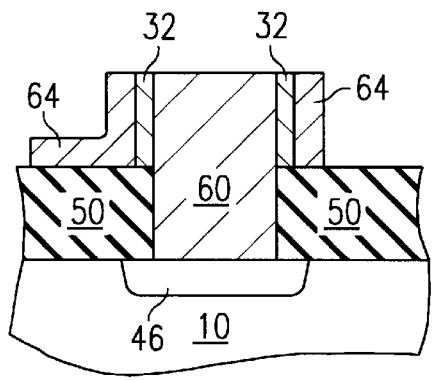
Figure 7:
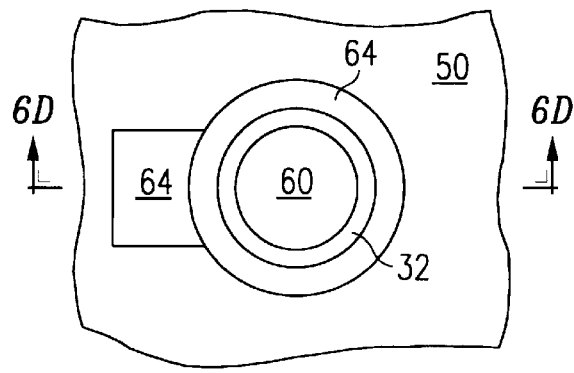
FIG. 7 is a plan view illustrating one possible configuration for the cross-section of FIG. 6D.

FIGS. 6A–6D show steps in a process for forming an attached contact for an, e.g. annular, electrode according to the present invention. FIG. 6A illustrates a structure similar to that of FIG. 3I, with a planarizng layer 66 (e.g. a doped spin-on glass) deposited over second conductive film 62. Layer 66 is preferably etched back to expose or nearly expose a topmost portion of film 62, but is preferably thicker than film 62 over field oxide 50. FIG. 6B shows layer 66 after a step of forming patterned photoresist 68 over layer 66 and selectively etching layer 66. Patterned photoresist 68 is typically removed after this selective etch. Second electrode 64 is defined as before (preferably by ion-milling) except that the remaining portion of layer 66 prevents the removal of the underlying portion of film 62 during ion-milling, resulting in a configuration such as shown in FIG. 6C. Layer 66 may be left in place, as shown in FIG. 6C, or selectively removed as shown in FIG. 6D. FIG. 7 shows a plan view of the cross section of FIG. 6D, illustrating the contact point which is integral to annular electrode 64. It may also be desirable with some configurations to perform the following procedure without planarizing layer 66, by depositing photoresist 68 directly over layer 62 and patterning.

Figure 8A:
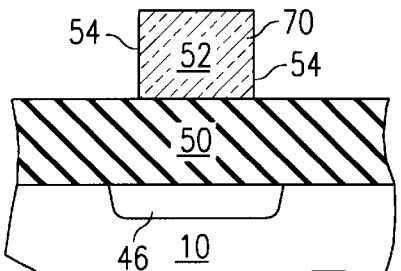
FIGS. 8A–8H contain cross-sections which illustrate steps in a detailed process according to the present invention for forming a capacitive structure electrically connected to a semiconductor substrate.
Figure 8B:
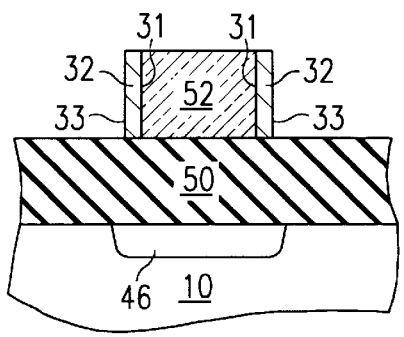
Figure 8C:
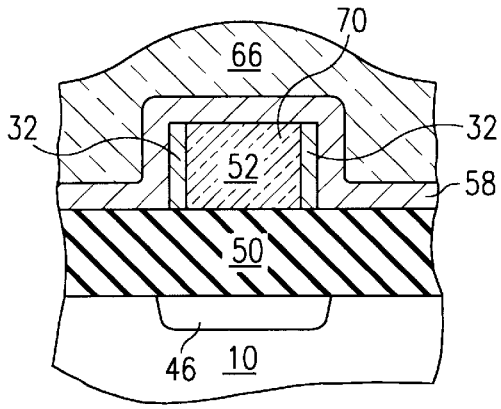
Figure 8D:
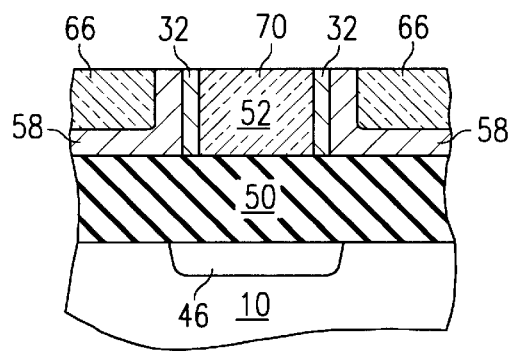
Figure 8E:
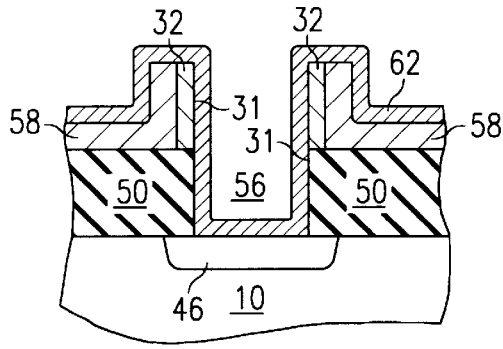
Figure 8F:
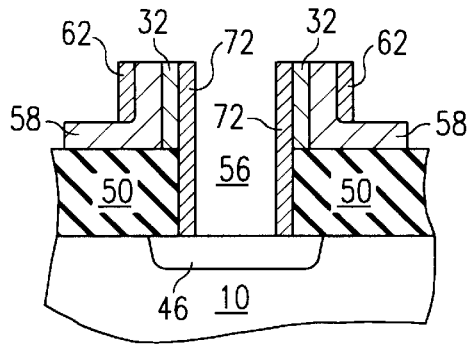
Figure 8G:
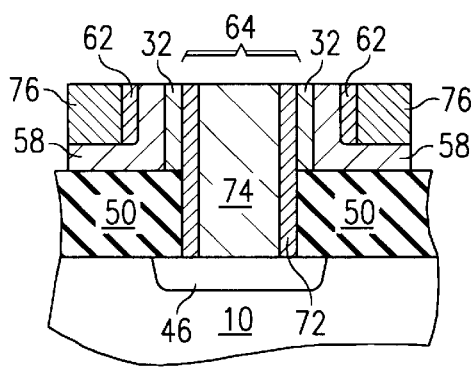
Figure 8H:
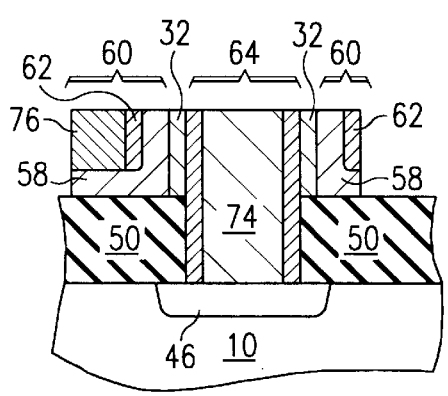

In another preferred embodiment shown in FIGS. 8A–8H, a temporary support having a vertical sidewall 54 may first be formed as a post 70 resembling what will later become the second electrode. A dielectric film 32 may be formed on sidewall 54 with an inner surface 31 in contact with sidewall 54 and a substantially vertical outer surface 33 as illustrated in FIG. 8B. FIG. 8C shows a first conductive film 58 and a planarizing layer 66 deposited over dielectric film 32 and post 70. Chemical-mechanical planarization or etchback may be used, for example, to remove conductive film 58 and planarizing layer 66 directly overlying dielectric film 32 and post 70, as shown in FIG. 8D. At this point, post 70 may be etched away to form an aperture 56 (FIG. 8E), which may also be extended to substrate 10. Typically the aperture forming step will also remove planarizing layer 66, but conductive film 58 protects field oxide 50 from the etch.

A number of approaches are possible for completing electrodes on dielectric film 32. FIGS. 8E–8H show an approach which uses an electrode having a thin shell of one conductive material and a core of a different conductive material. Such a structure may be preferable, as the thin shell may be of a material especially preferred for contacting the dielectric (e.g. a noble metal, preferably platinum). By using only a thin shell of platinum as opposed to a solid platinum plug, fabrication costs may be greatly reduced. The core may then be formed of a reactive contact material not preferred for contacting the dielectric, but more economical and/or preferred for forming electrical contact to the substrate. One preferred contact material is polysilicon; polysilicon/ platinum electrode structures may form platinum silicide where they contact each other, insuring good electrical continuity for the electrode.

Using principles previously described herein, FIGS. 8E–8H illustrate a process of first depositing and anisotropically etching a second conductive film 62 (preferably platinum), thereby forming a preferably annular electrode shell 72 in aperture 56. Aperture 56 may then be filled with a conductive material (e.g. polysilicon and/or TiN), forming a preferably cylindrical electrode core 74 and completing second conductive electrode 64. This step may comprise a blanket deposition of a conductive material, followed by etchback or chemical-mechanical polishing, and may leave conductive overlayer 76 overlying first conductive film 58. Generally, a masking step may then be used to protect electrode and dielectric areas while overlayer 76 and first conductive film 58 are removed from field oxide 50, resulting in a cross-section similar to FIG. 8H.

In the description of the preferred embodiments, sidewall capacitors have been shown in an ideal sense. In practice, deposition and ion-milling, for instance, may produce a region of thinned layers at the top of a capacitor structure. Thus the step typified in FIG. 2G may in some cases require a chemical-mechanical polishing step to remove a top portion of the structure. To avoid shorting, reliability, and breakdown problems, a chemical-mechanical polishing step may be used to polish the top of the capacitor structure down to a point where dielectric film 32 is substantially uniform in thickness.

The use of perovskite-phase dielectric materials in the present invention is preferred. An advantage of such a dielectric selection is a high selectivity to silicon nitride and silicon oxide etches, such that sacrificial layers and temporary supports may be formed using the latter materials. Also, the high dielectric constants achievable with perovskites allow the substantially vertical dielectric to be thicker, and thus more tolerant of process variations and non-uniformity.

Sidewall capacitance refers to capacitance as a result of electrodes separated by a substantially vertical dielectric film. As used herein, the term "substantially vertical" is defined as not more than a 10% variation from vertical, as measured from the top to the bottom of a surface. The term "essentially only sidewall capacitance" is defined as limiting a capacitor to only incidental capacitance other than that which is a result of sidewall capacitance.

Other modifications to these embodiments will be apparent to those skilled in the art upon reading this description. For example, electrode shell 72 may be formed prior to extending aperture 56 through field oxide 50, in which case shell 72 may not contact substrate 10. In principle, dielectric film 32 may extend quite near to or even contact substrate 10, if such contact does not cause destructive interdiffusion between the dielectric film and the substrate. Also, a silicided contact, such as titanium silicide, may be formed in aperture 56. Preferable electrode materials include noble metals such as Pt, Pd, and Au. Electrodes may also be wholly or partially constructed of other conductive materials, such as W, TiW, TiN, TiAlN, Ta, $TiSi_2$, Al and Cu metals and alloys thereof, doped polysilicon, and conductive oxides such as $RuO_2$. Some other preferred perovskite-phase dielectric materials include barium titanate, strontium titanate, bismuth titanate, strontium bismuth titanate, lead zirconate titanate, and lead lanthanum zirconate titanate. Although the sacrificial layer is preferably insulating, the layer or a sublayer thereof may be constructed of a suitable conductive material, such as tin oxide.

The Table provides a cross-reference between the Drawing and elements of some of the preferred embodiments.

TABLE

| # | Specific Term | General Term | Other Preferred Embodiments |
|---|---|---|---|
| 10 | single crystal silicon | semiconductor substrate | GaAs, silicon-on-insulator |
| 28 | vertical sidewall | temporary support | |
| 30 | silicon dioxide | sacrificial layer | multilayer combinations of silicon dioxide. silicon nitride, polysilicon, tin oxide, etc. |
| 32 | barium strontium titanate | dielectric film | barium titanate, bismuth titanate, lead zirconate titanate. strontium bismuth titanate, $SiO_2$, $SiO_2/Si_3N_4$ |
| 34 | platinum | first conductive film | Au, Pd, W, TiW, TiN, TiAlN, Ta, $TiSi_2$, Al, Cu doped poly, $RuO_2$ |
| 36 | platinum | first conductive eleccrode | same as 34 |
| 40 | platinum | second conductive film | same as 34 |
| 42 | platinum | second conductive electrode | same as 34 |
| 44 | thin film capacitor | capacitive structure | |
| 45 | | implant ions | |
| 46 | n- or p-doped silicon | doped region | |
| 50 | silicon dioxide | insulating bottom sublayer | silicon nitride over $SiO_2$ |
| 52 | silicon nitride | sacrificial top sublayer | polysilicon, doped glass |
| 54 | vertical sidewall | temporary support | |
| 56 | | aperture | |
| 58 | platinum | first conductive film | same as 34 |
| 60 | cylindrical electrode | first conductive electrode | Pt, same as 34 |
| 62 | platinum | second conductive film | same as 34 |
| 64 | annular electrode | second conductive electrode | Pt, same as 34 |
| 66 | dopod spin-on glass | planarizing layer | silica, silicon nitride, polysilicon |
| 68 | contact mask | patterned photoresist | |
| 70 | post | temporary support | |
| 72 | platinum | cylindrical electrode shell | noble metal (gold, palladium) |
| 74 | doped polysilicon | cylindrical elcctrode core | TiAlN, W, TiW, Ta, $TiSi_2$, Al, Cu, $RuO_2$, TiN |
| 76 | TiN | conductive overlayer | same as 74 |

What is claimed is:

1. A method of forming a microelectronic device on a semiconductor substrate, said method comprising the steps of:

forming a first layer overlying said substrate and comprising an insulating bottom sublayer and a sacrificial top sublayer;

anisotropicaily etching a pattern in said top sublayer, thereby creating an aperture having a substantially vertical sidewall extending through said top sublayer;

depositing a substantially conformal perovskite-phase dielectric film over said first layer, said film having an inner surface in contact with said sidewall and an outer surface;

extending said aperture through said bottom sublayer;

depositing a first conductive electrode within said aperture, thereby forming a conductive plug electrically contacting said substrate and said outer surface of said dielectric layer;

removing said sacrificial top sublayer in contact with said dielectric film thereby exposing said inner surface of said dielectric layer; and depositing a second conductive electrode electrically contacting said inner surface of said dielectric layer;

whereby said plug, said dielectric film, and said second conductive electrode complete a capacitive structure having two electrodes and an intervening dielectric wherein said dielectric is formed prior to formation of either electrode.

2. A method of forming a microelectronic device on a semiconductor substrate, said method comprising the steps of:

providing a sidewall;

forming a substantially vertical temporary support on said sidewall;

forming a substantially vertical dielectric film on said temporary support;

then forming a first conductive electrode on said dielectric film; and then replacing said temporary support with a second conductive electrode disposed on said dielectfic film to create a thin film capacitor, wherein said capacitor has a substantially vertical dielectric film which has been formed prior to formation of either said first or said second electrode.

3. A method of forming a microelectronic device on a semiconductor substrate, said method comprising the steps of:

providing a substrate;

forming an insulating layer overlying said substrate;

anisotropically etching a pattern in said insulating layer to create at least one substantially vertical sidewall extending at least partially through said insulating layer;

forming a dielectric film on said sidewall, said film having an inner surface in contact with said sidewall and a substantially vertical outer surface;

then forming a first conductive electrode directly upon said outer surface of said dielectric film;

removing at least a portion of said insulating layer contacting said inner surface of said dielectric film to at least partially expose said inner surface; and then forming a second conductive electrode electrically contacting said inner surface to form with said first and second conductive electrodes and said dielectric film a capacitive structure having two electrodes and an intervening dielectric, said dielectric film being formed prior to formation of either said first or said second electrode.

4. The method of claim 3, wherein said insulating layer comprises at least a bottom sublayer and a top sublayer, and wherein said bottom sublayer is substantially unaffected by said anisotropically etching step.

5. The method of claim 3, wherein said bottom sublayer comprises silica and said top sublayer comprises a material selected from the group consisting of silicon nitride and doped silicon dioxide.

6. The method of claim 3, wherein said forming a first conductive electrode step also completes an electrical connection between said first conductive electrode and said semiconductor substrate.

7. The method of claim 3, wherein said forming a second conductive electrode step also completes an electrical connection between said second conductive electrode and said semiconductor substrate.

8. The method of claim 3, wherein said anisotropically etching a pattern step forms an aperture defined by at least one of said sidewalls.

9. The method of claim 8, wherein said aperture is cylindrical.

10. The method of claim 8, further comprising, after said forming a dielectric film step, extending said aperture through said insulating layer to said semiconductor substrate using said aperture as an etch mask.

11. The method of claim 10, further comprising, after said extending said aperture step, ion implanting a dopant in said semiconductor substrate using said aperture as a self-aligned implant mask.

12. The method of claim 10, wherein said forming a first conductive electrode step comprises depositing a noble metal layer upon said outer surface of said dielectric film and filling said aperture with a conductive contact material.

13. The method of claim 3, wherein said anisotropically etching a pattern step forms a post defined by at least one of said sidewalls.

14. The method of claim 3, wherein said post is cylindrical.

15. The method of claim 3, wherein said forming a dielectric film step comprises the steps of substantially conformally depositing a dielectric film and anisotropically etching said dielectric film, whereby the dielectric film is removed except on said sidewalls.

16. The method of claim 3, wherein said dielectric film comprises a perovskite-phase dielectric material.

17. The method of claim 16, wherein said perovskite-phase dielectric material is barium strontium titanate.

* * * * *

UNITED STATES PATENT AND TRADEMARK OFFICE
CERTIFICATE OF CORRECTION

PATENT NO. : 6,033,919
DATED : March 7, 2000
INVENTOR(S) : Gnade et al.

It is certified that error appears in the above-identified patent and that said Letters Patent is hereby corrected as shown below:

Title page, insert the following item: -- [60] Provisional application No. 60/029,166 Oct. 25, 1996 --.

Column 1, line 3, insert the following:
-- CROSS REFERENCE TO RELATED APPLICATION
Reference is made to and priority claimed from U.S. provisional application Ser.
No. 60/029,166 Oct. 25, 1996, entitled METHOD OF FORMING SIDEWALL CAPACITANCE STRUCTURE --.

Signed and Sealed this

Sixth Day of March, 2001

Attest:

NICHOLAS P. GODICI

*Attesting Officer*     *Acting Director of the United States Patent and Trademark Office*